(12) United States Patent
Cho et al.

(10) Patent No.: US 8,470,668 B2
(45) Date of Patent: Jun. 25, 2013

(54) METHOD FOR FORMING PILLAR TYPE CAPACITOR OF SEMICONDUCTOR DEVICE

(75) Inventors: Ho Jin Cho, Seongnam-si (KR); Cheol Hwan Park, Icheon-si (KR); Dong Kyun Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 151 days.

(21) Appl. No.: 12/979,926

(22) Filed: Dec. 28, 2010

(65) Prior Publication Data

US 2012/0019980 A1 Jan. 26, 2012

(30) Foreign Application Priority Data

Jul. 20, 2010 (KR) ........................ 10-2010-0070128

(51) Int. Cl.
*H01L 21/8242* (2006.01)
(52) U.S. Cl.
USPC ............ 438/243; 438/244; 438/386; 438/387
(58) Field of Classification Search
USPC .................. 438/239–256, 386–399
See application file for complete search history.

(56) References Cited

U.S. PATENT DOCUMENTS

| 6,472,266 | B1 * | 10/2002 | Yu et al. .................... 438/241 |
| 2002/0123159 | A1 * | 9/2002 | Chi et al. .................... 438/3 |
| 2003/0003642 | A1 * | 1/2003 | Oh .................... 438/200 |
| 2004/0159909 | A1 * | 8/2004 | Kim et al. .................... 257/532 |
| 2012/0080771 | A1 * | 4/2012 | Yang et al. .................... 257/532 |

FOREIGN PATENT DOCUMENTS

| KR | 10-1998-064695 A | 10/1998 |
| KR | 1020030056809 A | 7/2003 |
| KR | 1020040008419 A | 1/2004 |

* cited by examiner

*Primary Examiner* — Dung A. Le
(74) *Attorney, Agent, or Firm* — William Park & Associates Patent Ltd.

(57) ABSTRACT

An embodiment of the invention includes a pillar type capacitor where a pillar is formed over an upper portion of a storage node contact. A bottom electrode is formed over sidewalls of the pillar, and a dielectric film is formed over pillar and the bottom electrode. A top electrode is then formed over the upper portion of the dielectric film.

17 Claims, 11 Drawing Sheets

METHOD FOR FORMING PILLAR TYPE CAPACITOR OF SEMICONDUCTOR DEVICE

CROSS-REFERENCE TO RELATED APPLICATION

The priority of Korean patent application No. 10-2010-0070128 filed on Jul. 20, 2010, the disclosure of which is hereby incorporated in its entirety by reference, is claimed.

BACKGROUND OF THE INVENTION

1. Field of the Invention

An embodiment of the present invention generally relates semiconductor devices, and more specifically to a pillar type capacitor of a semiconductor device and a method for forming the same.

2. Description of the Related Art

Due to rapid development of the process technology of small-sized semiconductors, high-integration of memory products has is been accelerated to reduce the unit cell area and lower the operating voltage. However, the charging capacity required in the operation of memory devices has been continuously required to be over 25 fF/cell in order to prevent generation of soft errors and shortening of the refresh time.

In order to secure the charging capacity required in the next generation DRAM products, MIM-type capacitors adopting a high-k dielectric film have been developed.

In DRAM products adopting a fine metal line process of 50 nm~60 nm, in order to obtain the cell capacitance of over 25 fF/cell, the structure of the storage node is changed from a concave shape into a cylinder shape, thereby obtaining a larger charging capacitance.

However, it is difficult to use the cylinder-type storage node structure in giga DRAM products having a fine metal line width of less than 50 nm because a space where a capacitor can be formed by depositing a dielectric film of about 100 Å and a plate node of about 200 Å is not sufficiently provided in a cell region while securing a space of over 25 nm (250 Å) for insulation between the adjacent storage nodes.

BRIEF SUMMARY OF THE INVENTION

According to an embodiment of the present invention, a pillar type capacitor of a semiconductor device comprises: a pillar disposed over an upper portion of the storage node contact; a bottom electrode disposed at sidewalls of the pillar; a dielectric film disposed over the pillar and the bottom electrode; and a top electrode disposed over the is dielectric film.

A lower portion of the pillar has a larger cross-section area than an upper portion of the pillar.

The pillar type capacitor further comprises: an interlayer insulating film disposed to substantially the same height as the storage node contact; and a metal layer disposed over the upper portion of the interlayer insulating film and the storage node contact and in contact with the bottom electrode, thereby reducing a contact resistance.

The metal layer is at least one of: Ti and TiSi. The pillar type capacitor where the upper portion of the pillar comprises a storage node oxide pillar. The additional height of the pillar due to the storage node oxide pillar increases electrode area of the pillar type capacitor.

The storage node oxide pillar includes at least one of: TEOS (Tetra Ethyl Ortho Silicate), PSG (Phospho Silicate Glass), BPSG (Borophospho Silicate Glass), USG (Undoped Silicate Glass) and HDP (High Density Plasma).

The pillar type capacitor further comprises a barrier metal layer disposed between the pillar and the bottom electrode, wherein the barrier metal layer comprises TiSi in order to minimize a contact resistance.

The bottom electrode includes TiN. The dielectric film includes at least one of: $ZrO_2$, $HfO_2$, ZrSiOx, ZrHfOx and ZrHfSiOx.

The pillar includes at least one of: P-doped polysilicon, B-doped polysilicon and B-doped SiGe. The top electrode has a deposition is structure including CVD-TiN and PVD-TiN or a deposition structure including ALD-TiN and PVD-TiN, thereby obtaining a metal insulator metal (MIM) capacitor.

According to an embodiment of the present invention, a method for forming a pillar type capacitor of a semiconductor device, comprises: forming a pillar over an upper portion of a storage node; forming a bottom electrode at sidewalls of the pillar; forming a dielectric film over the pillar and the bottom electrode; and forming a top electrode over the dielectric film.

After forming a storage node contact, the method further comprises forming a metal layer in contact with the bottom electrode and over the upper portion of the storage node contact, thereby minimizing a contact resistance. The metal layer includes Ti or TiSi.

The forming-a-pillar includes: forming a pillar material layer over the upper portion of the storage node contact; and etching the pillar material layer to have a pillar shape.

The pillar includes at least one of P-doped polysilicon, B-doped polysilicon and B-doped SiGe, which can serve as a contact.

The forming-a-pillar includes: depositing a polysilicon layer over the upper portion of the storage node contact; and implanting ions into the polysilicon layer.

The etching-the-pillar-material-layer includes etching at least a portion of the pillar material layer not used for forming the pillar type capacitor, thereby.

The etching-the-pillar-material-layer includes: forming a hard mask layer over the upper portion of the pillar material layer; etching the hard mask layer in a first direction; etching the hard mask layer in a second direction perpendicular to the first direction; and removing the hard mask layer, thereby obtaining a pillar type capacitor having a fine line width.

After forming the pillar, the method further comprises forming an oxide pillar over the upper portion of the pillar. The pillar is formed to have a high height. The oxide pillar includes at least one of: TEOS (Tetra Ethyl Ortho Silicate), PSG (Phospho Silicate Glass), BPSG (Borophospho Silicate Glass), USG (Undoped Silicate Glass) and HDP (High Density Plasma).

Before forming a pillar, the method further comprises removing the pillar in a peripheral circuit region of the semiconductor substrate.

Before forming a bottom electrode, the method further comprises forming a barrier metal layer over the surface of the pillar, thereby minimizing contact resistance.

The forming-a-barrier-metal-layer includes: forming a Ti layer over the surface of the pillar; and subjecting the Ti layer to thermal treatment to form a TiSi layer.

The forming-a-bottom-electrode includes: forming a TiN layer over the upper portion of the interlayer insulating film and the pillar; and performing an etch-back process to remove a part of the TiN is layer so that a bottom electrode separated from each other in each cell.

The dielectric film includes at least one of $ZrO_2$, $HfO_2$, ZrSiOx, HfSiOx, ZrHfOx and ZrHfSiOx.

The forming-a-top-electrode includes: depositing a TiN film by a physical vapor deposition (PVD) process after depositing a TiN film over the upper portion of the dielectric film by a chemical vapor deposition (CVD) process, or depositing a TiN film by a PVD process after depositing a TiN film over the upper portion of the dielectric film by an atomic layer deposition (ALD) process.

DESCRIPTION OF EMBODIMENTS

The present invention will be described in detail with reference to the attached drawings.

FIGS. 1 to 9 are diagrams illustrating an exemplary method for forming a pillar type capacitor of a semiconductor device. FIGS. 1-4, 6a, 7-9 are cross-sectional views. FIG. 6b is a perspective view of FIG. 6a. FIGS. 5a and 5b are plane views.

Figure 1:
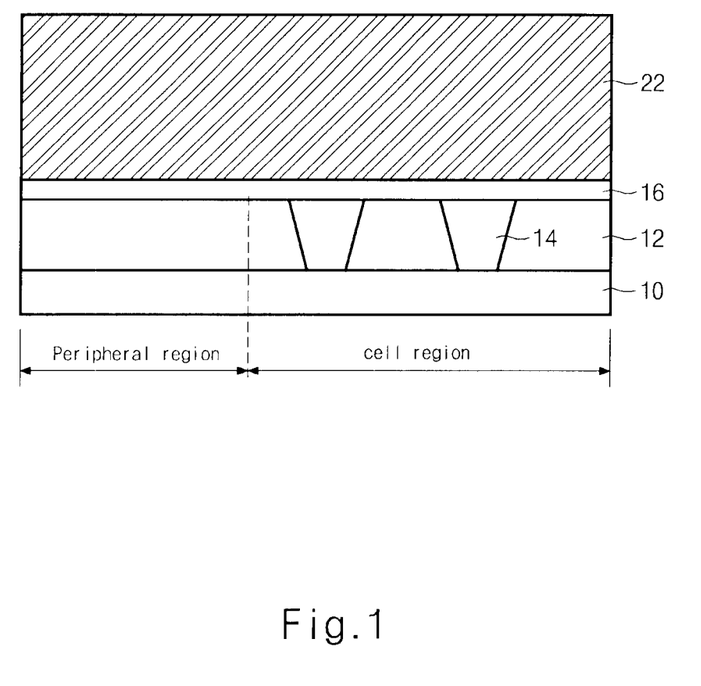
FIGS. 1 to 9 are diagrams illustrating an exemplary method for forming a pillar type capacitor of a semiconductor device.

Referring to FIG. 1, an interlayer insulating film 12, which may comprise, for example, a dielectric material, is formed on a semiconductor substrate 10 including a cell region and a peripheral region. The interlayer insulating film 12 includes an oxide film. A gate or is a bit line is formed in the lower portion of the interlayer insulating film 12.

After a mask pattern such as a photoresist film is formed on the interlayer insulating film 12 of the cell region, the interlayer insulating film 12 is etched with the mask pattern as a mask to form a storage node contact hole that exposes the semiconductor substrate or a landing plug. A conductive material such as polysilicon is filled in the storage node contact hole to form a storage node contact plug 14.

Material such as, for example, Ti or TiSi is used to form a metal layer 16 with a given thickness on the interlayer insulating film 12 including the storage node contact plug 14. The metal layer 16 can reduce a contact resistance between the storage node contact plug 14 and a bottom electrode 32 (see FIG. 7). When the metal layer 16 is formed with TiSi, for example, a Ti layer may first be deposited and subjected to a thermal treatment process, thereby forming a TiSi layer.

A pillar material layer 22 is deposited on the metal layer 16. The pillar material layer 22 may comprise at least one or more materials such as, for example, P-doped polysilicon, B-doped polysilicon and B-doped SiGe. The pillar material layer 22 may be deposited, for example, by a method of implanting ions after forming an undoped polysilicon or SiGe layer.

Figure 2:
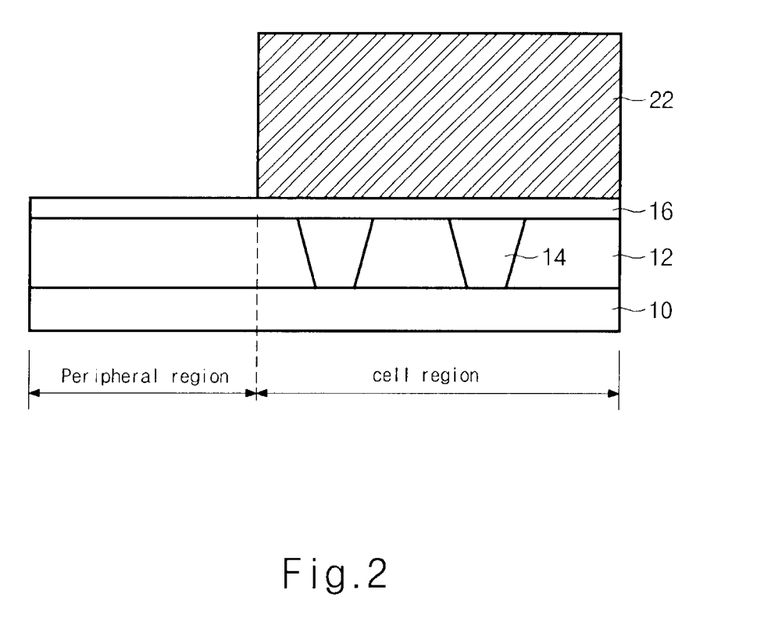

As shown in FIG. 2, after forming a mask (not shown) that opens the peripheral region, the pillar material layer 22 is etched with the mask to remove the pillar material layer 22 of the peripheral region. This may be because the pillar material layer 22 is not required in the peripheral region where a capacitor is not formed. However, various embodiments of the invention may leave the pillar material 22 rather than remove it.

Figure 3:
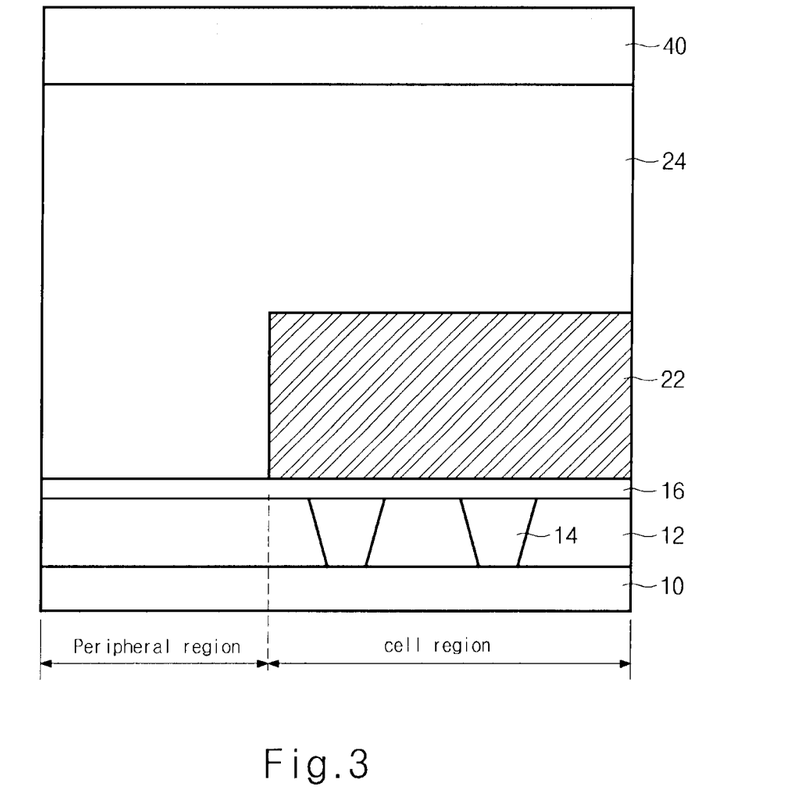

Referring to FIG. 3, after an oxide pillar material layer 24 is deposited on the pillar material layer 22 of the cell region and the metal layer 16 of the peripheral region, the oxide pillar material layer 24 is planarized and a hard mask layer 40 is formed on the resultant structure. The oxide pillar material layer 24 may comprise one or more materials such as, for example, TEOS (Tetra Ethyl Ortho Silicate), PSG (Phospho Silicate Glass), BPSG (Borophospho Silicate Glass), USG (Undoped Silicate Glass) or HDP (High Density Plasma). The hard mask layer 40 may include, for example, amorphous carbon.

The oxide pillar material 24 may be optional for various embodiments of the invention. However, the oxide pillar material 24 as an insulating material enables a pillar to be formed with a higher height than without it. When the pillar material 22 only including polysilicon without the oxide pillar material layer 24, it is difficult to deposit the polysilicon thickly so that a capacitor having a broad area cannot be formed. As a result, when the oxide pillar material 24 is formed on the pillar material layer 22 as shown in FIG. 3, a high pillar structure may be formed subsequently.

Figure 4:
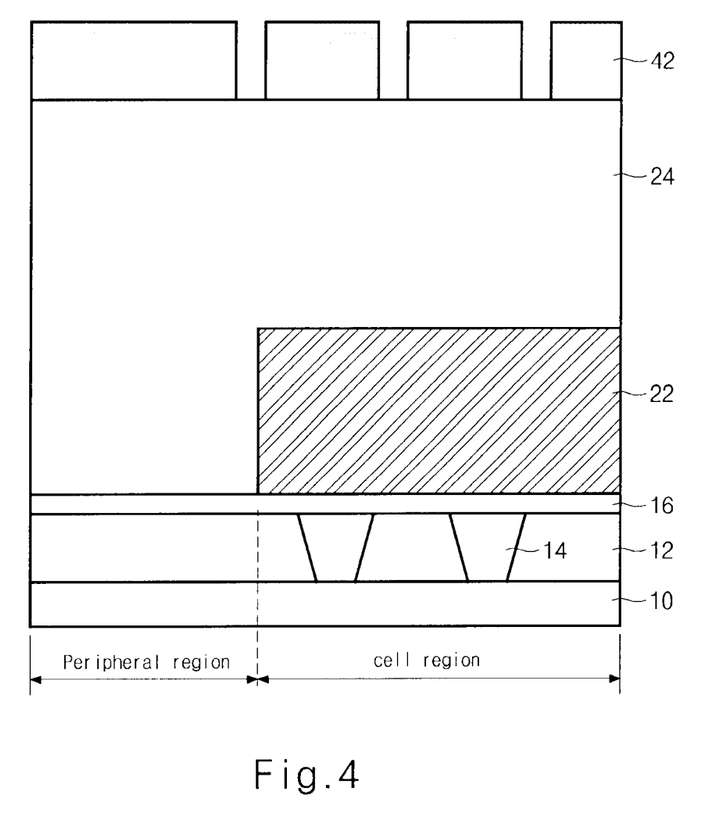

As shown in FIG. 4, after a photoresist pattern (not shown) is formed on the hard mask layer 40, the hard mask layer 40 is etched with the photoresist pattern as a mask to form a hard mask pattern 42.

Figure 5A:
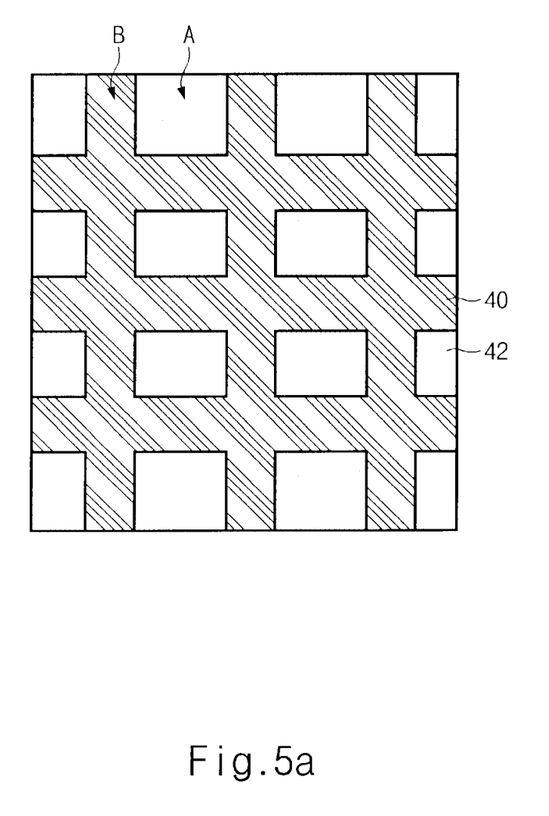
Figure 5B:
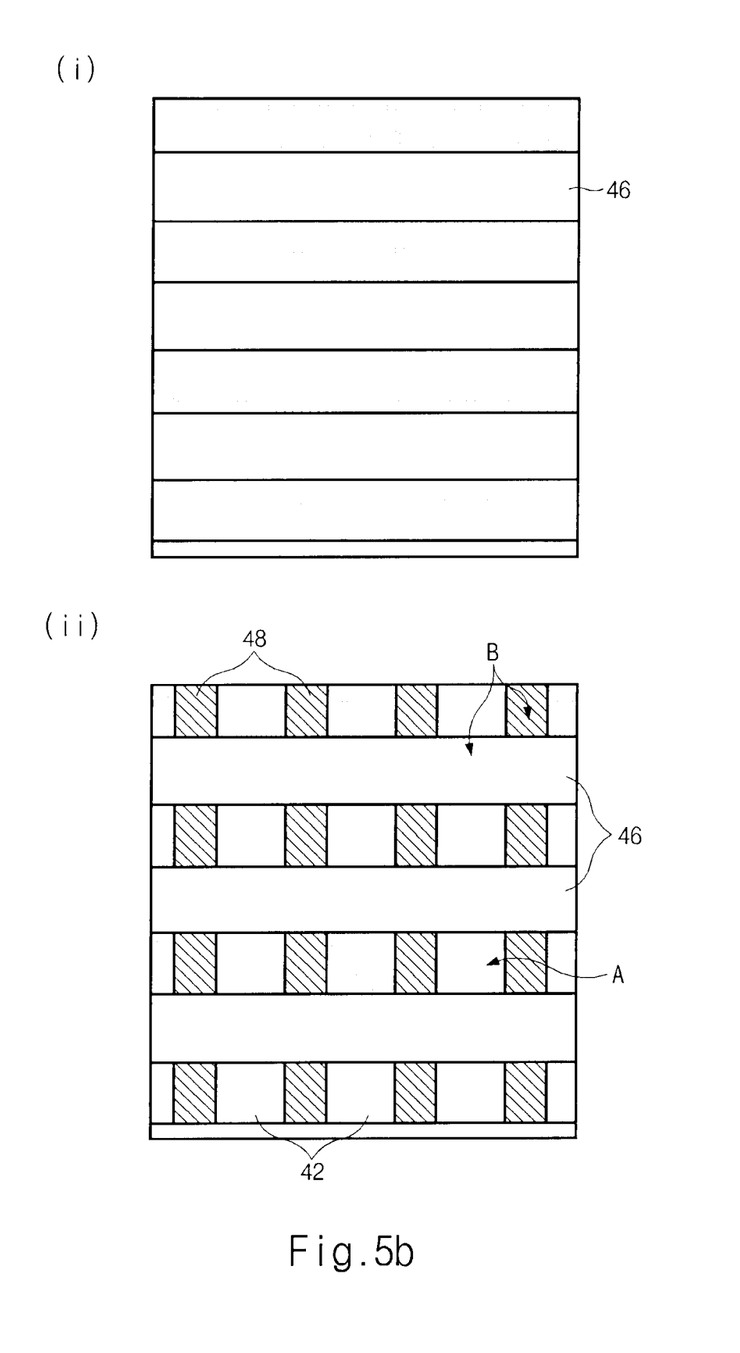

FIGS. 5a and 5b show the process of forming the hard mask pattern 42 in more detail.

As shown in FIG. 5a, in various embodiments of the invention, the hard mask layer 40 may be etched to a lattice pattern in one etching process using a lattice pattern photoresist pattern (not shown). FIG. 5b shows, as may be used in various embodiments of the invention, two etching processes for etching the hard mask layer 40 to a lattice pattern. Referring to (i) of FIG. 5b, after a first etching process is performed with a photoresist pattern 46 having a line type extended toward a horizontal direction, a second etching process is performed with a photoresist pattern 48 having a line type extended toward a vertical direction so as to form a lattice type hard mask pattern 42.

When a line-width of the hard mask pattern is sufficiently large, the etching method of FIG. 5a can be performed. However, when the hard mask pattern 42 having a line-width of less than 30 nm is formed, the two-step etching method of FIG. 5b is performed. As a result, a patterning margin is more increased, thereby obtaining the accurate hard mask pattern 42.

As shown in FIGS. 5a and 5b, in an embodiment of the present invention, a space region B, rather than a capacitor region A, is etched to form a pillar. A conventional process for forming a pillar type capacitor requires forming a bottom electrode and performing a dip-out process to remove the rest region. However, in an embodiment of the present invention, before a bottom electrode is formed, a pillar shape is previously etched. As a result, a dip-out process is not required.

Figure 6A:
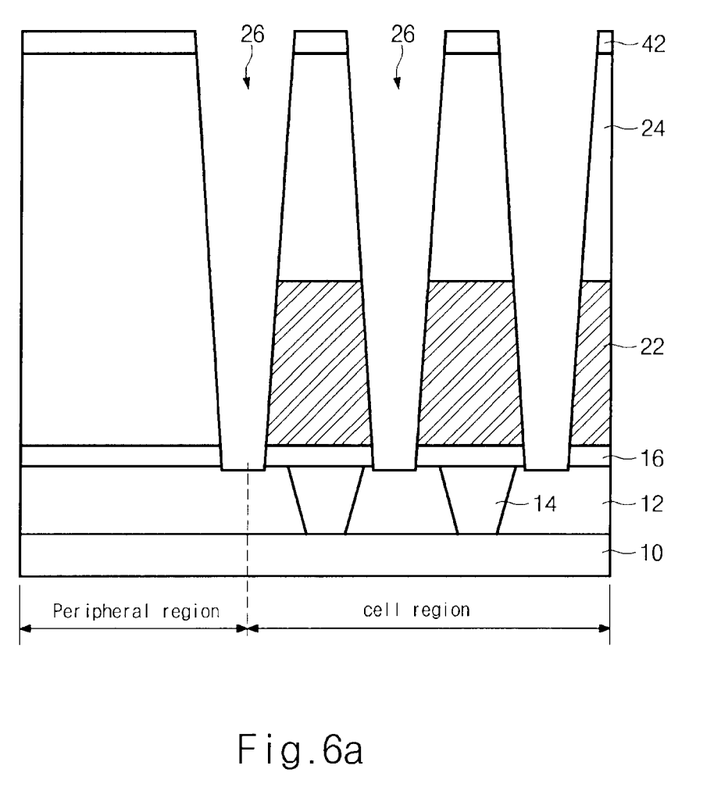
Figure 6B:
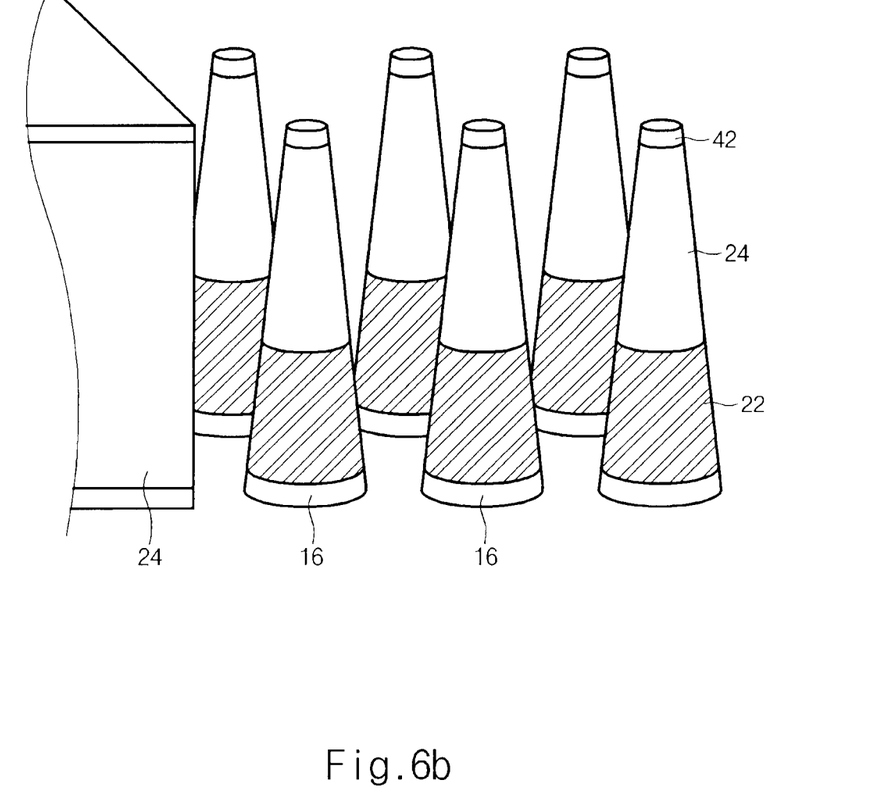

Referring to FIGS. 6a and 6b, the oxide pillar material layer 24, the pillar material 22 and the metal layer 16 are etched with the hard mask pattern 42 as a mask, thereby forming a storage node hole 26 and simultaneously a deposition structure including the metal layer 16, the pillar 22 and the oxide pillar 24. Because various embodiments of the present invention include a process for etching a pillar material without a dip-out process, the deposition structure including the pillar 22 and the oxide pillar 24 may be formed to have a truncated cone shape with a top line-width larger than a bottom line-width. As a result, the deposition structure including the metal pattern 16, the pillar 22 and the oxide pillar 24 is formed on the top portion of the storage node contact plug 14 as shown in FIG. 6a.

While a cone shape is shown for this embodiment of the invention, the invention need not be so limited. Other structures, such as, for example, pyramidal structures may also be used. Accordingly, the pillar 22 and the oxide pillar 24 may form a pillar whose lower portion may have a cross-section area that is larger than the upper portion.

The pillar 22 serves as a column for forming a pillar type capacitor while serving as a contact for electrically coupling a bottom electrode 33 (see FIG. 8) with the storage node contact plug 14 or the metal layer 16.

Figure 7:
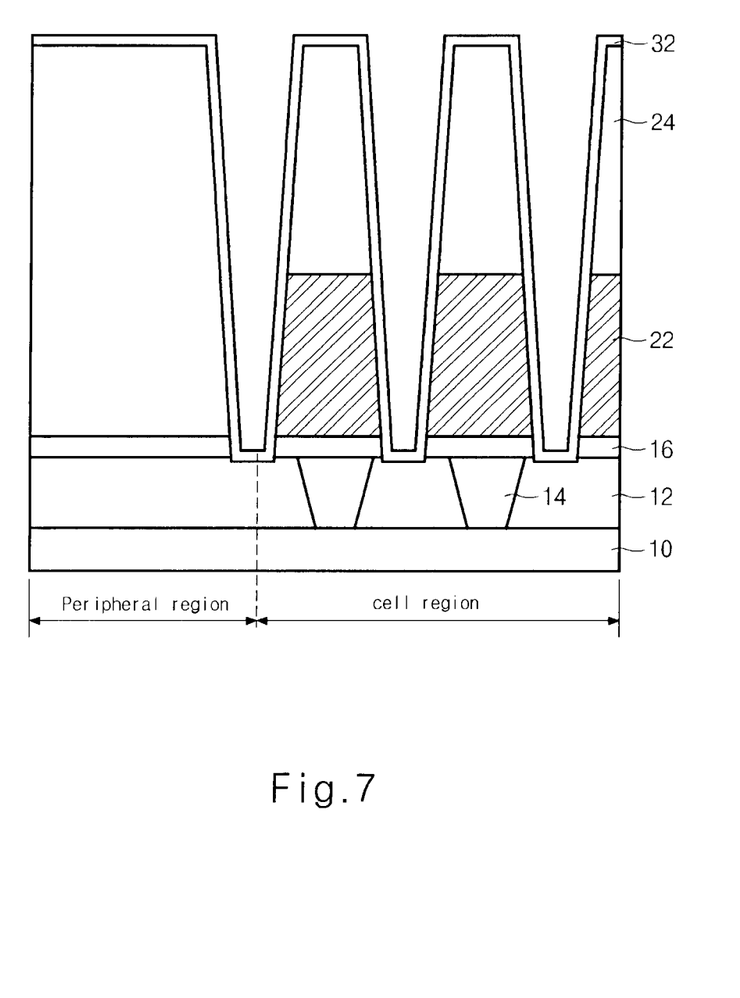

As shown in FIG. 7, the hard mask pattern 42 is removed, and the bottom electrode material 32 is deposited on the surfaces including the interlayer insulating film 12, the metal layer 16, the pillar 22 and the oxide pillar 24. The bottom electrode material 32 may comprise, for example, a TiN film.

Before the bottom electrode material 32 is deposited, a barrier metal layer (not shown) may be thinly formed on the surface that includes the interlayer insulating film 12, the metal layer 16, the pillar 22 and the oxide pillar 24, thereby reducing resistance of the pillar 22 and the bottom electrode material 32. During this process, a Ti layer (not shown) may be thinly formed on the entire surface including the pillar 22 and subjected to a thermal treatment process so as to form a TiSi layer (not shown). As a result, the bottom electrode material 32 may be formed on the surface of the TiSi layer.

Figure 8:
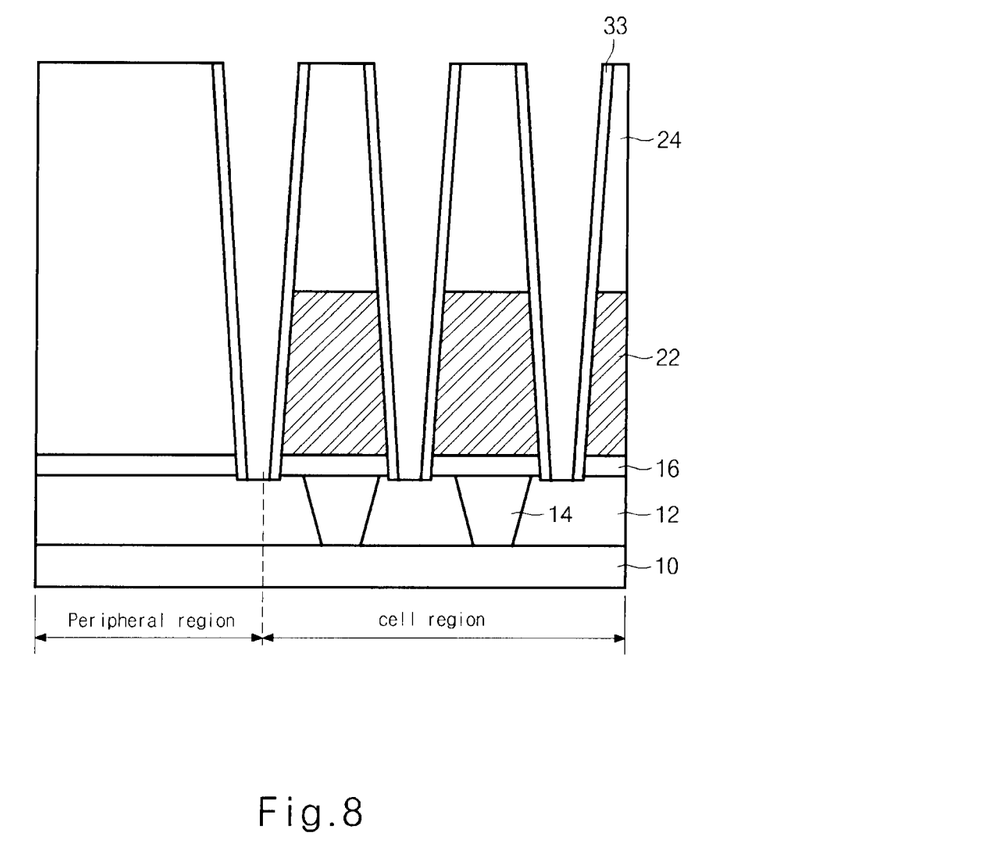

Referring to FIG. 8, an etch-back process is performed to remove the bottom electrode material 32 formed on the upper portion of the oxide pillar 24 and the bottom electrode material 32 formed on the surface of the interlayer insulating film 12 between the pillars 22. As a result, a separate bottom electrode 33 is formed in each cell.

Figure 9:
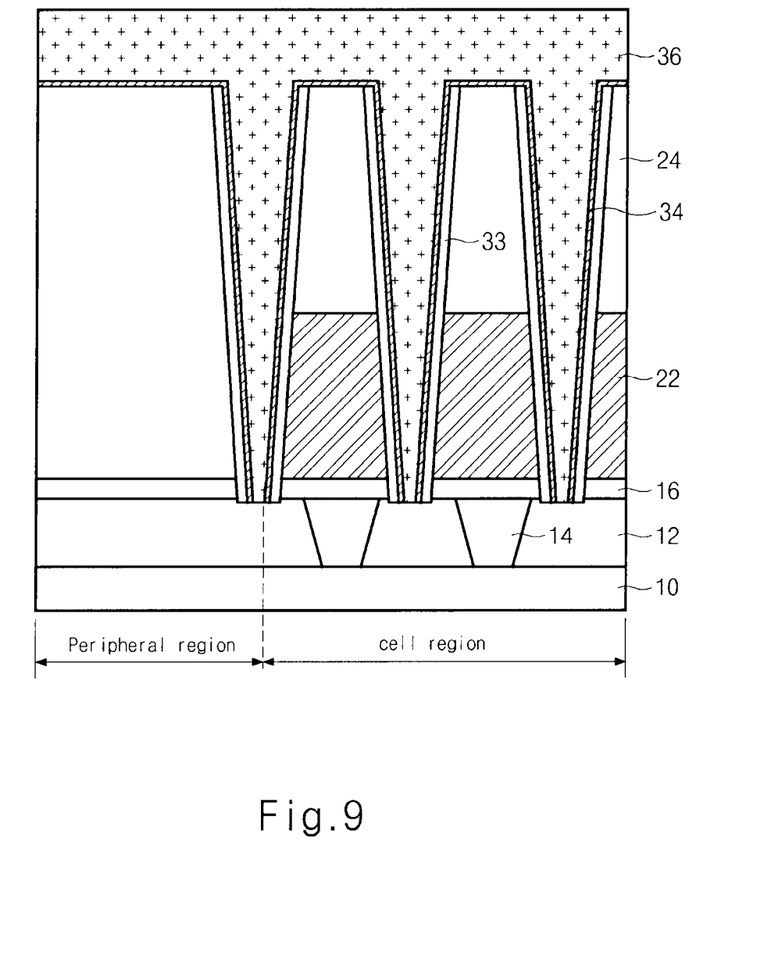

As shown in FIG. 9, a dielectric film 34 is deposited on the upper portion of the bottom electrode 33 and a top electrode 36 is deposited thereon, thereby forming a pillar type capacitor. The process for depositing the dielectric film 34 may use, for example, an Atomic Layer Deposition (ALD) method so as to include at least one or more materials such as, for example, $ZrO_2$, $HfO_2$, $ZrSiOx$, $ZrHfOx$ and $ZrHfSiOx$. The process for forming the top electrode 36 may be performed by a Chemical Vapor Deposition (CVD), ALD or Physical Vapor Deposition (PVD) method so as to deposit, for example, a TiN film. In various embodiments of the invention, when the top electrode 36 is deposited, a TiN film may be deposited by a double process such as, for example, CVD and PVD or ALD and PVD.

As described above, in the embodiment of the present invention, a pillar type capacitor having a small line-width can be formed without a dip-out process, thereby preventing a bunker defect and collapse of a bottom electrode so as to facilitate the manufacturing process.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pillar type capacitor of a semiconductor device, the method comprising:
    forming a pillar electrically coupled with an upper portion of a storage node contact;
    forming a bottom electrode at sidewalls of the pillar;
    forming a dielectric film over the pillar and the bottom electrode; and
    forming a top electrode over the dielectric film.

2. The method according to claim 1, wherein a lower portion of the pillar has a larger cross-section area than an upper portion of the pillar.

3. The method according to claim 1, further comprising forming a metal layer in contact with the bottom electrode and over the upper portion of the storage node contact.

4. The method according to claim 1, wherein the metal layer is at least one of: Ti or TiSi.

5. The method according to claim 1, wherein the forming-a-pillar comprises:
    forming a pillar material layer over the upper portion of the storage node contact; and
    etching the pillar material layer to have a pillar shape.

6. The method according to claim 5, wherein the pillar comprises at least one of: P-doped polysilicon, B-doped polysilicon and B-doped SiGe.

7. The method according to claim 5, wherein the forming-a-pillar comprises:
    depositing a polysilicon layer over the upper portion of the storage node contact; and
    implanting ions into the polysilicon layer.

8. The method according to claim 5, wherein the etching-the-pillar-material-layer comprises etching at least a portion of the pillar material layer not used for forming the pillar type capacitor.

9. The method according to claim 1, wherein the etching-the-pillar-material-layer comprises:
    forming a hard mask layer over the upper portion of the pillar material layer;
    etching the hard mask layer in a first direction;
    etching the hard mask layer in a second direction perpendicular to the first direction; and
    removing the hard mask layer.

10. The method according to claim 1, further comprising forming an oxide pillar over the upper portion of the pillar.

11. The method according to claim 10, wherein the oxide pillar comprises at least one of: TEOS (Tetra Ethyl Ortho Silicate), PSG (Phospho Silicate Glass), BPSG (Borophospho Silicate Glass), USG (Undoped Silicate Glass) and HDP (High Density Plasma).

12. The method according to claim 10, further comprising removing the pillar in a peripheral circuit region of the semiconductor device.

13. The method according to claim 1, further comprising forming a barrier metal layer over the surface of the pillar before forming a bottom electrode.

14. The method according to claim 13, wherein the forming-a-barrier-metal-layer comprises:
    forming a Ti layer over the surface of the pillar: and
    subjecting the Ti layer to thermal treatment to form a TiSi layer.

15. The method according to claim 1, wherein the forming-a-bottom-electrode comprises:
    forming a TiN layer over the upper portion of the interlayer insulating film and the pillar; and
    performing an etch-back process to remove a part of the TiN layer.

16. The method according to claim 1, wherein the dielectric film comprises at least one of: $ZrO_2$, $HfO_2$, $ZrSiOx$, $HfSiOx$, $ZrHfOx$ and $ZrHfSiOx$.

17. The method according to claim 1, wherein the forming-a-top-electrode comprises one of:
    depositing a TIN film over the upper portion of the dielectric film by a chemical vapor deposition (CVD) process then depositing a TiN film by a physical vapor deposition (PVD) process; and
    depositing a TiN film over the upper portion of the dielectric film by an atomic layer deposition (ALD) process then depositing a TiN film by a PVD process.

* * * * *